United States Patent
Takahashi et al.

(10) Patent No.: US 8,451,063 B2
(45) Date of Patent: May 28, 2013

(54) WIDEBAND LOW NOISE SENSOR AMPLIFIER CIRCUIT

(75) Inventors: Masayoshi Takahashi, West Bloomfield, MI (US); Norio Chujo, Yokohama (JP); Masami Makuuchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 13 days.

(21) Appl. No.: 12/892,988

(22) Filed: Sep. 29, 2010

(65) Prior Publication Data

US 2012/0075021 A1   Mar. 29, 2012

(51) Int. Cl.
*H03F 3/08* (2006.01)

(52) U.S. Cl.
USPC ............................................... 330/308

(58) Field of Classification Search
USPC ................. 330/308; 333/213–217; 250/214 A
See application file for complete search history.

(56) References Cited

U.S. PATENT DOCUMENTS

| 6,785,477 | B1 * | 8/2004 | Masuda et al. | 398/208 |
| 2010/0066452 | A1 | 3/2010 | Kawashima et al. | |

FOREIGN PATENT DOCUMENTS

| JP | 62130012 A * | 6/1987 | 333/216 |
| JP | 2008-288817 | 11/2008 | |
| JP | 2009-016979A | 1/2009 | |

* cited by examiner

*Primary Examiner* — Robert Pascal
*Assistant Examiner* — Khiem Nguyen
(74) *Attorney, Agent, or Firm* — Gifford, Krass, Sprinkle, Anderson & Citkowski, P.C.

(57) ABSTRACT

A circuit having a sensor with a stray capacitance value. An output from the sensor is connected to the input of an amplifier while a negative capacitance circuit is electrically connected in parallel with the sensor output. The negative capacitance circuit reduces the effect of the sensor stray capacitance to provide an increased bandwidth and decreased noise on the amplifier output.

9 Claims, 1 Drawing Sheet

WIDEBAND LOW NOISE SENSOR AMPLIFIER CIRCUIT

BACKGROUND OF THE INVENTION

I. Field of the Invention

The present invention relates generally to sensor amplifier circuits.

II. Description of Related Art

During the evaluation, design, and testing of electronic circuits, many types of different sensors are utilized. Especially, electrical/optical sensors, magnetic/optical sensors, and loop antenna current sensors are all useful devices for the development and investigation of electromagnetic capability as well as signal/power integrity for many types of electronics.

These sensors utilize a photo sensor to detect a signal from the device under test. Furthermore, such sensors require both a wideband and low noise amplifier in order to test high frequency circuits with high accuracy.

One disadvantage of these sensors, and particularly photo sensors, is that the sensor exhibits stray capacitance which is coupled to the input of the amplifier. This stray capacitance not only reduces bandwidth of the amplifier output, but also increases the noise in the amplifier output. Such decreased bandwidth and increased noise inhibit accurate readings during the test or evaluation.

SUMMARY OF THE PRESENT INVENTION

The present invention provides a sensor circuit which overcomes the above-mentioned disadvantages of the previously known devices.

In brief, the sensor circuit of the present invention includes a sensor having an output. The sensor also exhibits stray capacitance which results from the design of the sensor.

An output from the sensor is provided as an input to an amplifier to amplify the sensor output. The stray capacitance of the sensor is likewise coupled to the amplifier input.

In order to reduce the adverse effect of the sensor stray capacitance, a negative capacitance circuit is electrically connected in parallel with the sensor output and thus with the input to the amplifier. In one design, the negative capacitance circuit includes an amplifier having its output connected to one lead of a capacitor. The other lead of the capacitor as well as the input to the amplifier is connected in parallel with the sensor output. Consequently, by adjusting the gain of the second amplifier, a negative capacitance is inserted between the sensor and the sensor amplifier which effectively reduces the adverse effects of the stray capacitance of the sensor.

In practice, the negative capacitance is adjusted to a value less than the value of the stray capacitance and preferably one half the value of the stray capacitance. By doing so, the output noise from the amplifier is reduced while expanding bandwidth for the sensor circuit.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF PREFERRED EMBODIMENTS OF THE PRESENT INVENTION

Figure 1:
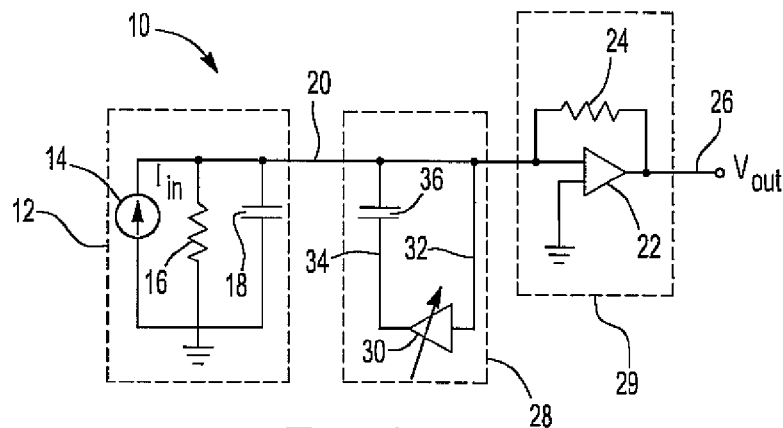
FIG. 1 is a schematic view illustrating a first preferred embodiment of the present invention.

With reference first to FIG. 1, a first preferred embodiment of a sensor circuit 10 in accordance with the present invention is shown. In the conventional fashion, the sensor circuit 10 includes a sensor 12, such as a photo diode sensor.

The sensor 12 includes an electric current source 14, whose amount of current generated varies as a function of the intensity of the light in the case of a photo diode sensor. The sensor 12 also includes an output resistance as indicated by resistor 16.

The sensor 12 exhibits stray capacitance illustrated as a capacitor 18 coupled in parallel with the resistor 16 and the current source 14. This capacitor 18, furthermore, adversely affects the bandwidth and noise level on the output 26 from the sensor circuit 10.

The sensor output 20 is coupled as an input signal to a high-gain amplifier 22. A feedback resistor 24 controls the trans-impedance of the trans-impedance amplifier 29 so that an output 26 from the amplifier 22 forms the output from the sensor circuit 10.

In order to reduce the adverse affect of the sensor stray capacitor 18, a negative capacitance circuit 28 is electrically connected in parallel with the sensor output 20. The magnitude of the negative capacitance circuit 28, furthermore, is less than the stray capacitor 18 and, as will hereinafter be described in greater detail, preferably about one half of the magnitude of the stray capacitor 18.

Still referring to FIG. 1, the negative capacitance circuit 28 is formed by a variable gain amplifier 30 having its input 32 connected to the output 20 from the sensor 12. An output 34 from the amplifier 30 is coupled to one lead of a capacitor 36 while the other lead of the capacitor 36 is also connected to the sensor output 20.

The instantaneous negative capacitance of the negative capacitance circuit 28 varies as a function of the instantaneous voltage on the input 32 to the amplifier 30. The magnitude of the negative capacitance $C_{negative}$ is given by the following formula:

$$C_{negative} = C_c(1 - A_{v2})$$

where $C_c$=the capacitance of the capacitor 36;

$A_{v2}$=the voltage gain of the amplifier 30

Figure 2:
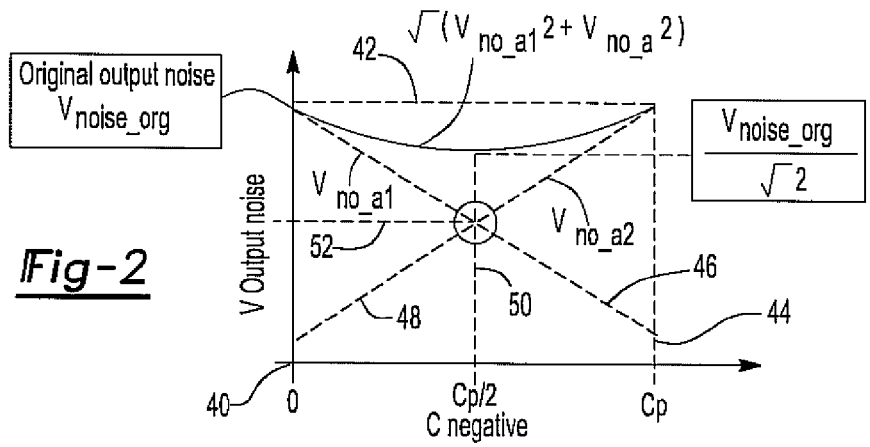
FIG. 2 is a graph illustrating the operation of the preferred embodiment of the present invention.

With reference now to FIG. 2, the overall effect of the insertion of the negative capacitance circuit 28 is illustrated as a graph magnitude of the output noise on the vertical axis versus the magnitude of the negative capacitance from the negative capacitance circuit 28 on the horizontal axis. This graph, furthermore, assumes that the inherent noise of both amplifiers 22 and 30 are substantially the same.

The value of the overall output noise from the sensor circuit is determined as follows:

$$V_{noise} = \sqrt{V_{no\_a1}^2 + V_{no\_a2}^2}$$

where $V_{noise}$=total output noise $V_{no\_a1}$=output noise of amplifier 22

$V_{no\_a2}$=output noise of amplifier 30

$C_p$=stray capacitance 18 of the sensor 12

This, as can be seen from FIG. 2, if the negative capacitance is set at zero as shown at 40, the negative capacitance circuit 28 has no effect so that the overall noise from the sensor circuit 10 is equal to the overall noise level of the amplifier 22 as shown at 42.

Similarly, as the magnitude of the negative capacitance from the negative capacitance circuit 28 increases up to the value $C_p$ as shown at 44, the overall noise level from the amplifier 22 as shown by line 46 decreases while the overall noise attributable to the amplifier 32 increases as shown by line 48. Since it was assumed that the internal noise of both amplifiers 22 and 30 were the same, the overall noise level when $C_{negative}$ equals the magnitude of the stray capacitance on the capacitor $C_p$ 18, the overall noise level is also shown at 42.

However, by adjusting the value of the negative capacitance circuit 28 so that the negative capacitance equals one half the magnitude of the stray capacitance 18 as shown by line 50, the overall noise from the sensor circuit 10 illustrated by graph line 43 is determined as follows:

$$V_{noise} = \sqrt{(V_{no\_a1})^2 + (V_{no\_a2})^2}$$

If $$V_{no\_a1} = V_{no\_a2} = \frac{1}{2} V_{noise\_org}$$

$$V_{noise} = \frac{V_{noise\_org}}{\sqrt{2}}$$

Thus, if the magnitude of negative capacitance is set to a half of the stray capacitance 18 of the sensor 12, the negative capacitance circuit effectively reduces the overall noise from the sensor circuit 10 to $$\frac{1}{\sqrt{2}},$$

while expanding its bandwidth of the sensor circuit 10 to the double.

Figure 3:
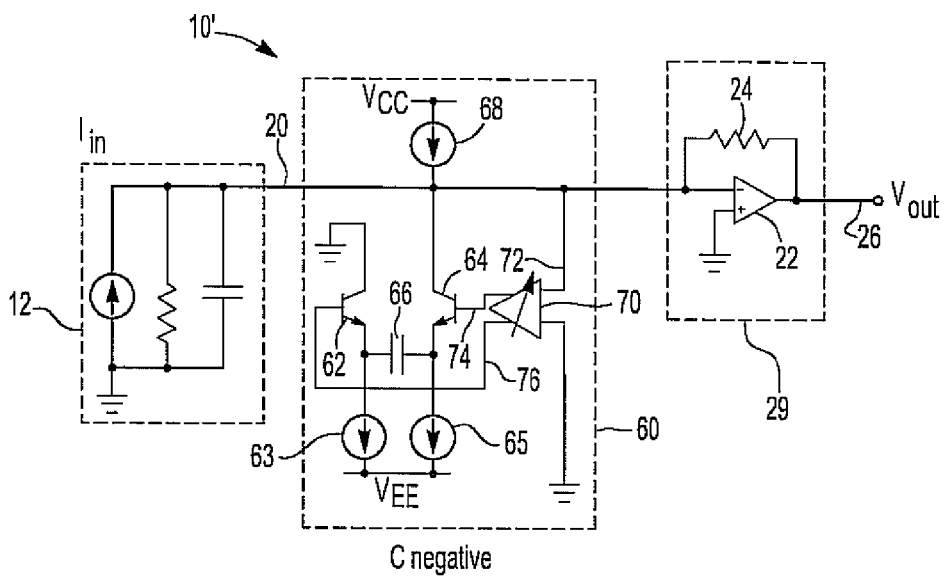
FIG. 3 is a schematic view illustrating a second preferred embodiment of the present invention.

With reference now to FIG. 3, a modification of the sensor circuit 10' is illustrated. In this modification, the sensor 12 and trans-impedance amplifier 29 are the same as previously described. Therefore, that description is incorporated by reference.

However, unlike the embodiment of the invention illustrated in FIG. 1, a different negative capacitance circuit 60 is illustrated. Instead, the negative capacitance circuit 60 includes a pair of substantially identical bipolar transistors, 62 and 64. Although any type of transistor may be utilized, as shown, the transistor 64 is having its collector attached to the output line 20 from the sensor 12, and the collector of the transistor 62 is connected to ground. The capacitor 66 is connected between the emitters for the transistors 62 and 64 and both emitters are also connected to current sources 63 and 65. The current source 68 provides bias current to the transistor 64.

A variable differential amplifier 70 has its noninverting input 72 electrically connected to the sensor output 20. A noninverting output 74 from the amplifier 70 is connected to the base of the transistor 64 while, similarly, an inverting output 76 from the amplifier 70 is coupled to the base of the other transistor 62.

Consequently, the transistors 62 and 64 form a push-pull pair in which only one of the transistors 62 and 64 is on or conducting at a given time. Furthermore, the embodiment shown in FIG. 3 is further advantageous since the common mode noise can be reduced because the negative capacitance circuit 60 is almost in the difference mode.

The value of the negative capacitance of the negative capacitance circuit 60 is determined by the following formula:

$$C_{negative} = C_c(1 - A_{v3})$$

where $C_{negative}$=the magnitude of the negative capacitance;
$C_c$=the capacitance of the capacitor 66;
$A_{v3}$=the gain of the differential amplifier 70

From the foregoing, it can be seen that the present invention provides a simple and inexpensive sensor circuit which enjoys both decreased output noise as well as increased bandwidth. Having described our invention, however, many modifications thereto will become apparent to those skilled in the art to which it pertains without deviation from the spirit of the invention as defined in the appended claims.

We claim:

1. A sensor system comprising:
a sensor having a capacitance value and an output,
an amplifier having an input connected to the sensor output, and
a negative capacitance circuit electrically connected in parallel with said sensor output,
wherein said negative capacitance circuit comprises:
a first and second transistor, each having a base, an emitter and a collector,
wherein the first transistor's said collector being connected to said sensor output and said emitter being connected to a first current source, and the second transistor's said collector being connected to a ground voltage level and said emitter being connected to a second current source,
a capacitor electrically connected between said emitters of said transistors,
a third current source being connected to the output of said sensor,
a second amplifier having a non-inverting input connected to said sensor output, an inverting input connected to ground level, a non-inverting output connected to the base of said first transistor, and an inverting output connected to the base of said second transistor,
wherein said first and second transistor and said capacitor act as a differential pair for an AC input signal.

2. The sensor system as defined in claim 1 wherein said negative capacitance circuit comprises the second amplifier having an input and an output, the capacitor having a first and a second lead, said second amplifier input being connected to said sensor output, said sensor output being connected to said first lead of said capacitor, and said second lead of said capacitor being connected to said sensor output.

3. The sensor system as defined in claim 2 wherein said second amplifier comprises a variable gain amplifier.

4. The sensor system as defined in claim 1 wherein the magnitude of said negative capacitance is less than the magnitude of the capacitance of said sensor.

5. The sensor system as defined in claim 4 wherein the magnitude of said negative capacitance is substantially one half the magnitude of the capacitance of said sensor.

6. The sensor system as defined in claim 1 wherein said second amplifier comprises a variable gain amplifier.

7. The sensor system as defined in claim 1 wherein said second amplifier comprises a differential variable gain amplifier.

8. The sensor system as defined in claim 1 wherein the magnitude of said negative capacitance is less than the magnitude of the capacitance of said sensor.

9. The sensor system as defined in claim 8 wherein the magnitude of said negative capacitance is substantially one half the magnitude of the capacitance of said sensor.

\* \* \* \* \*